(12) United States Patent
Hackemeier

(10) Patent No.: US 12,113,337 B2
(45) Date of Patent: Oct. 8, 2024

(54) CABLE INLET DEVICE FOR A SWITCHGEAR CABINET AND ARRANGEMENT AND METHOD FOR OPERATING SAME

(71) Applicant: HARTING Electric Stiftung & Co. KG, Espelkamp (DE)

(72) Inventor: Florian Hackemeier, Rahden (DE)

(73) Assignee: HARTING Electric Stiftung & Co., KG, Espelkamp (DE)

( * ) Notice: Subject to any disclaimer, the term of this patent is extended or adjusted under 35 U.S.C. 154(b) by 194 days.

(21) Appl. No.: 17/795,681

(22) PCT Filed: Feb. 12, 2021

(86) PCT No.: PCT/DE2021/100140
§ 371 (c)(1),
(2) Date: Jul. 27, 2022

(87) PCT Pub. No.: WO2021/170175
PCT Pub. Date: Sep. 2, 2021

(65) Prior Publication Data
US 2023/0058718 A1    Feb. 23, 2023

(30) Foreign Application Priority Data
Feb. 26, 2020  (DE) .................. 10 2020 104 994.3

(51) Int. Cl.
*H02B 1/30* (2006.01)
*H02G 15/013* (2006.01)
(Continued)

(52) U.S. Cl.
CPC ........... *H02B 1/305* (2013.01); *H02G 15/013* (2013.01); *H05K 5/0247* (2013.01); *H02G 3/083* (2013.01); *H05K 5/069* (2013.01)

(58) Field of Classification Search
CPC . H02B 1/26; H02B 1/30; H02B 1/305; H02B 1/013; H02B 1/28; H02B 1/38;
(Continued)

(56) References Cited

U.S. PATENT DOCUMENTS 5,422,436 A    6/1995  Zachrai
7,049,515 B1 *  5/2006  Collins .................. H02G 3/083
                                                          174/58
(Continued)

FOREIGN PATENT DOCUMENTS

DE           4207281 C1    4/1993
DE       102016114577 A1    2/2018
(Continued)

OTHER PUBLICATIONS

Machine translation completed May 1, 2024, EP-2845277-B1 by Bauerkaemper et al. (Year: 2024).*

*Primary Examiner* — Zachary Pape
*Assistant Examiner* — Steven Ngo
(74) *Attorney, Agent, or Firm* — Smartpat PLC

(57) ABSTRACT

A cable inlet device consists substantially of an open frame part and at least one sealing insert arranged therein. This cable inlet device is attached to a switchgear cabinet so that the sealing insert and the frame part of the cable inlet device terminate flush with the opening. When the switchgear cabinet is closed, for example by a switchgear cabinet door or switchgear cabinet wall or the like, this door or wall is sealingly pressed with a counterpart seal against the cable inlet device. For replacement of cables it is merely necessary for the switchgear cabinet door/switchgear cabinet wall to be opened and for the cable to be changed to be removed together with the corresponding sealing element, and for the new cable to be provided with a matching sealing element and to be inserted.

17 Claims, 5 Drawing Sheets

(51) Int. Cl.
*H05K 5/02* (2006.01)
*H02G 3/08* (2006.01)
*H05K 5/06* (2006.01)

(58) Field of Classification Search
CPC ........ H02B 1/301; H02G 15/013; H02G 3/02; H02G 3/22; H05K 5/02; H05K 5/0247; H05K 5/069
See application file for complete search history.

(56) References Cited

U.S. PATENT DOCUMENTS

| | | | | |
|---|---|---|---|---|
| 2003/0102143 | A1* | 6/2003 | Sato | H02G 15/10 |
| | | | | 174/663 |
| 2009/0159332 | A1* | 6/2009 | Holmberg | H02G 3/22 |
| | | | | 174/650 |
| 2009/0302034 | A1* | 12/2009 | Makela | H02G 3/088 |
| | | | | 174/152 G |
| 2010/0187371 | A1 | 7/2010 | Milton | |
| 2014/0062399 | A1* | 3/2014 | Moon | B60L 53/65 |
| | | | | 320/109 |
| 2017/0332498 | A1* | 11/2017 | Larsson | H02G 3/088 |
| 2019/0237901 | A1 | 8/2019 | Schoenfeld et al. | |
| 2019/0237954 | A1 | 8/2019 | Ferderer | |
| 2020/0169072 | A1* | 5/2020 | Ehmann | H02G 15/007 |
| 2021/0373267 | A1* | 12/2021 | Radelet | H02G 15/013 |
| 2022/0271520 | A1* | 8/2022 | Steidl | H02G 3/083 |
| 2022/0337044 | A1* | 10/2022 | Vastmans | G02B 6/44775 |

FOREIGN PATENT DOCUMENTS

| | | | |
|---|---|---|---|
| EP | 0560119 | B1 | 12/1995 |
| EP | 2746634 | A1 | 6/2014 |
| EP | 2845277 | A2 * | 3/2015 ............... F16L 5/14 |
| ES | 2167149 | A1 | 5/2002 |
| KR | 100835679 | B1 | 6/2008 |
| KR | 20100017932 | A | 2/2010 |
| WO | 2006037522 | A1 | 4/2006 |

* cited by examiner

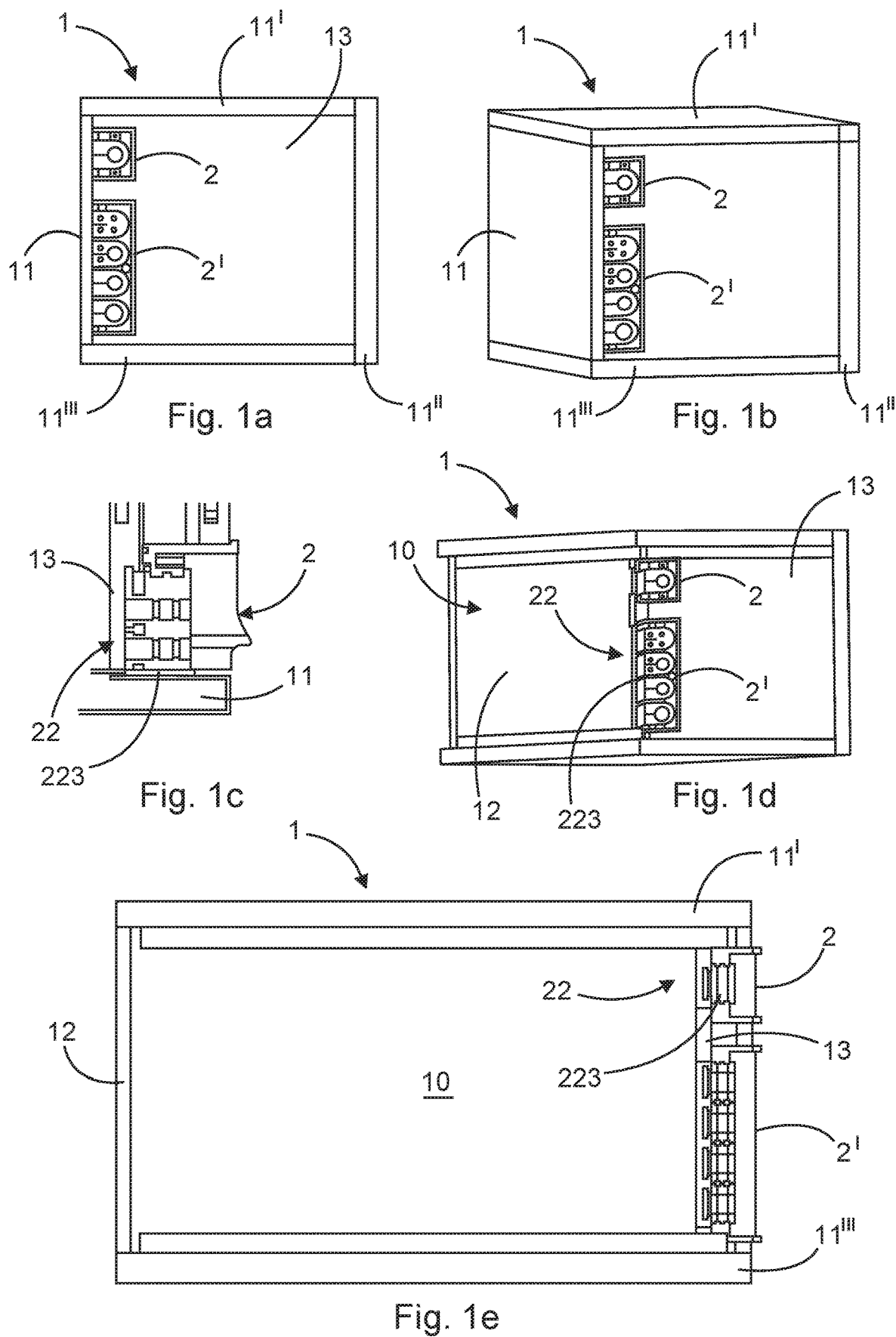

CABLE INLET DEVICE FOR A SWITCHGEAR CABINET AND ARRANGEMENT AND METHOD FOR OPERATING SAME

TECHNICAL FIELD

The disclosure relates to a cable inlet device for a switchgear cabinet, to an arrangement comprising a switchgear cabinet and a cable inlet device, and to a method for operating such an arrangement. Devices, arrangements, and methods of this kind are required in order to insert cables into switchgear cabinets, to fasten said cables to said switchgear cabinets with strain relief, and to seal said cables at their region of insertion.

BACKGROUND

Cable entry systems for switchgear cabinets are known from the prior art, for example from the Wikipedia article: https://en.wikipedia.org/wiki/Cable_entry_system.

Document EP 2 746 634 A1 discloses a comparable cable holder with a U-shaped frame and a number of sealing inserts ("grommets") for guiding cables through. This cable holder has a U-shaped frame with two limbs and a bar connecting the two limbs to one another. Furthermore, the cable holder has a number of sealing inserts. Each of these sealing inserts has at least one bore for guiding a cable through. The cable holder furthermore has a pin, which in the assembled state connects the two limbs to one another and exerts a pressure on the sealing inserts fitted with a cable. Proceeding from this prior art, the document proposes forming the pins and/or the frame from elastic material, wherein the two ends of the pin and the free ends of the limbs have recesses or protrusions, which together form a snap-fit connection.

It is furthermore known in the prior art to modify attachment housings originating from the field of heavy-duty plug connectors, in such a way that they are suitable as a cable entry system for switchgear cabinets.

Document EP 2 845 277 B1 discloses a bushing housing for one or more cables. This housing has a housing lower part, which is designed to be arranged on a switchgear cabinet housing, and furthermore has a housing upper part. The latter can be brought from an open state, in which it is not fixed to the housing lower part, into a closed state, in which it is fixed to the housing lower part and covers the latter in particular in a sealing manner. At least one cable bushing seal for receiving a cable, in particular a prefabricated cable, is provided in the housing lower part. The bushing housing additionally comprises a strain-relief means for the at least one cable. It is additionally disclosed to also arrange cable bushing seals and strain-relief means in the housing upper part.

A disadvantage with this design is that the sealing behavior between the cable bushing seals on either side and a ring seal, which is standard and necessary for sealing between the housing parts, according to experience is significantly compromised on account of the so-called "T-shape" of this entire sealing arrangement. In addition, a certain cable elongation may be noted for cables that are held in the housing upper part when the upper part is closed. This overall arrangement is therefore not only disadvantageous from a technical viewpoint, but additionally relatively complex and costly.

In order to achieve improvements in the operation and the sealing effect, document DE 10 2016 114 577 A1 proposes, building thereon, the following: separate strain-relief elements, such as cable clamps or cable ties, are attached to an inner side of a preferably one-part attachment housing. These strain-relief elements are actuatable through an assembly window, which is provided on an opposite housing side. By closing the window with a cover, the seal elements are compressed and seal the cables with respect to the attachment housing.

A disadvantage in all these known arrangements is that their construction and use is very complex. They have a large number of costly individual parts and the installation time is undesirably high. In the field, the exchangeability of the cables with the associated seal elements is furthermore complex and difficult.

The German Patent and Trade Mark Office has searched the following prior art in the priority application to the present application: EP 0 560 119 A1, DE 42 07 281 C1, ES 2 167 149 A1, DE 10 2016 114 577 A1, EP 2 845 277 B1 and EP 2 746 634 A1.

SUMMARY

This application discloses a simple and practically manageable cable inlet device for a switchgear cabinet and furthermore describing an arrangement and a method which simplify the equipping of a switchgear cabinet. In particular, the subsequent replacement of cables inserted into the switchgear cabinet is to be facilitated.

The object is achieved by the subject matter of the independent claim.

Advantageous embodiments of the invention are described in the dependent claims in the following description.

A cable inlet device for a switchgear cabinet has a rigid frame part—that is to say for example consisting of a rigid material. The frame part has an assembly face for fastening to a switchgear cabinet wall provided as an assembly wall in the region of a wall aperture provided for insertion of a cable into the switchgear cabinet. The assembly wall may be—depending on the structure of the switchgear cabinet and depending on the particular requirements—a side wall in an embodiment that is expedient and therefore advantageous for the particular application or may also be a front and/or rear wall of the switchgear cabinet. On its assembly face, the frame part has an assembly seal for sealing with respect to said assembly wall of the switchgear cabinet. This assembly seal can be formed for example by a sealing face, for example a suitably cut rubber film. Alternatively or additionally, however, it may also have a seal that is held and guided in a seal groove of the assembly face, wherein this seal groove surrounds the seal recesses on three sides.

In principle, therefore, the face of the frame part in and/or on which the assembly seal is arranged can be considered to be the assembly face. Opposite the assembly face, the frame part has a side face.

Furthermore, in order to be fastened in or on the switchgear cabinet, the frame part has a fastening device, for example screw passages with associated screws or also a quick fastening device which will be described in detail hereinafter, for fastening, in particular screwing, the frame part to the assembly wall or to any other fastening device provided in the vicinity of the assembly wall in the switchgear cabinet, in particular to a mounting device, for example to fastening rails or the like.

In an advantageous embodiment, the screw passages may to this end start in particular at said side face and run through the frame part and end at the assembly face of the frame part. For example, the frame part can be screwed from the inside or from the outside to the assembly wall of the switchgear cabinet by means of screws inserted into the screw passages.

As already mentioned, in an alternative embodiment as a fastening device, a quick fastening device as follows can also be used instead of a screw connection:

To this end, at least one, preferably a plurality of, in particular two, in particular rectangular detent windows can be provided both on the frame part and on the assembly wall. The detent windows of the assembly wall can correspond in size and shape to the detent windows of the frame part, and, to fasten these parts to one another, lie directly above one another during the assembly process.

In a preferred embodiment, the frame part can have at least one, preferably a plurality of, in particular two fastening flange(s), in each of which one of said detent windows of the frame part is arranged.

Furthermore, in order to fasten a frame part, at least one, preferably a plurality of, in particular two quick fastening device(s) are provided. These each have a detent housing, which preferably can be guided form fittingly through the detent windows.

Furthermore, the quick fastening devices have detent means, for example detent hooks mounted resiliently in the detent housing and each having a run on chamfer and a detent face angled therefrom preferably at an acute angle. The detent hooks, as the detent housing is plugged through the detent windows of the frame part and of the assembly wall lying one against the other, can thus be slid into the detent housing initially against the spring force by means of their run on chamfers. Due to the return force of the detent spring, the detent hooks, however, are then pressed outwardly again by the detent spring in the fully plugged in—i.e., assembled—state and latched with their detent face behind the detent window of the assembly wall to ultimately mechanically fasten the frame part to the assembly wall. On the frame part side, the detent connection housing can preferably for this purpose have a stop face, for example a peripheral stop flange, by means of which it is pressed in the assembled state against the frame part, in particular against the flange of the frame part.

The detent face of the detent hook, which then presses from the opposite side of the detent window against the assembly wall, does not necessarily have to run here parallel to this stop face, in particular this stop flange. Instead, it can advantageously have an angle to the stop flange that is approximately greater than 0°, preferably greater than 2.5°, and in particular is greater than 5°. Due to the return force of the detent spring, the stop face, in particular the stop flange, and thus also the corresponding fastening flange of the frame part, is then drawn by the detent hook against the assembly face and in this way holds the frame part against the assembly wall by way of frictional engagement.

With such detent fastening means, the attachment housing can be assembled on a device wall advantageously without tools. For comfortable disassembly, these detent fastening means can be easily removed again from the device wall by means of an unlocking tool: for example, the unlocking tool can be an L shaped unlocking pin, which is inserted with its tip into an unlocking opening of the detent housing and is actuated, for example rotated, at its lever region protruding at right angles, whereby a mechanism in the detent housing is actuated, by means of which the detent elements can be sunk again in the detent housing, against the spring force, in order to release the fastening.

In a further embodiment, the at least one quick fastening device can be part of a frame part, for example by its detent housing and its stop flange being formed in one piece together with the frame part, whereby the quick fastening device is fixedly connected to the frame part. In this case, the frame part itself of course does not require any detent windows.

The assembly seal arranged on the assembly face of the frame part is pressed here—from the inside or from the outside according to the side of the attachment—against the corresponding assembly wall of the switchgear cabinet, wherein the assembly seal surrounds the wall aperture, intended to guide the cable through, at least on three sides in an advantageous development.

In a preferred embodiment, the frame part can have a cuboidal basic shape. The assembly face and the side face of the frame part can then run parallel to one another and each has a rectangular basic shape. They can then be connected to one another via four substantially rectangular edge faces of the cube. Here, the term "substantially" can mean that at least one of the edge faces is interrupted by at least one recess.

In particular, the assembly face and the side face are connected to one another via a front face of the frame part oriented at right angles to said assembly face and side face. This front face can be formed here by one of said edge faces of the cube. In the assembled state, it is arranged at least in the vicinity of—in particular directly at—a switchgear cabinet opening. The front face runs level. In the assembled state, it can thus terminate flush with a free edge of said assembly wall, to which it is fastened—and thus also with said switchgear cabinet opening.

Here and hereinafter, it is clear to a person skilled in the art that the terms "planar" and "level" and in particular "flush" are to be understood within the scope of the usual manufacturing and assembly tolerances and elasticities of the corresponding components.

The frame part furthermore has at least one, preferably a plurality of concave U shaped seal recess(es) starting on its front face and extending into the frame part. The front face of the frame part is thus interrupted in the region of at least one seal recess.

The cable inlet device furthermore has at least one elastic sealing insert. This sealing insert has a convex U shaped insert contour complementary to the seal recess and thus can be inserted form fittingly and with frictional engagement into the corresponding seal recess of the frame part.

Each sealing insert has at least one continuous, cylindrical bushing opening and an insertion slot for inserting a cable into this cable bushing opening. Furthermore, each sealing insert has, on the side not comprised by its convex, U shaped insert contour, a level closing face, through which the insertion slot can run in a preferred development. Alternatively, however, the insertion slot can also run through the insert contour.

When the sealing insert is ultimately inserted into the frame part, the closing face of the sealing insert terminates flush with the front face of the frame part. The front face of the frame part and the closing face of the sealing insert—within the scope of the usual manufacturing tolerances and elasticities—then form a planar, continuous contact face.

Both the front face of the frame part and the closing face can thus be sealed simultaneously and with a particularly high sealing effect by means of a counterpart seal running in a straight line, by pressing the counterpart seal flat against this contact face.

In an advantageous embodiment, the sealing behavior of the planar contact face can be improved by the following advantageous embodiment: the frame part can have additional indentations, in particular linear positioning recesses, at least in its front face on either side of its U shaped seal recesses. In a preferred embodiment, these two positioning recesses can also consist of a peripheral channel arranged in the entire seal recess or can be connected by such a channel.

The sealing inserts have integrally molded positioning shapings, complementary thereto, which, as the sealing insert is inserted into the frame part, can be introduced at least in some regions form fittingly, in particular form fittingly and with frictional engagement, into said positioning recesses. This serves on the one hand to provide the most accurate positioning possible of the sealing insert in question, that is to say to ensure its correct orientation and correct position in the frame part, which, in itself, already represents an advantage.

A particularly important further advantage lies additionally in the following: the additional indentation/positioning recesses of adjacent seal recesses, in a preferred development, can adjoin one another directly in the front face of the frame part, so that the seal recesses are also connected to one another via these indentations in the front face. If the seal elements are then specifically ultimately inserted into the frame part, they directly adjoin one another with their likewise accordingly lengthened integrally molded positioning shapings and can thus also form, on the frame side, a continuous seal. At the same time, as already mentioned, they of course also terminate in a planar manner with the front side of the frame part. The sealing effect can be significantly increased further still as a result of this arrangement.

In any case, a planar contact face is created on the cable inlet device from the front face of the frame part and the closing face of the sealing insert and can be sealed by means of a counterpart seal running in a straight line by pressing the counterpart seal flat against this contact face.

The counterpart seal can to this end be attached on a straight, in particular flat object, in particular a switchgear cabinet closing element. The switchgear cabinet closing element will also be explained in greater detail hereinafter and serves to tightly close the switchgear cabinet. For example, it can be formed in a switchgear cabinet door that can be closed shut, a switchgear cabinet lid that can be latched shut and/or a plate that can be screwed on, for example the front wall.

The switchgear cabinet closing element can be pressed sealingly with a counterpart seal preferably attached thereto against the contact face, that is to say against the closing face of the at least one seal element and against the front face of the at least one frame part arranged on the switchgear cabinet opening.

An arrangement comprises a switchgear cabinet having a plurality of switchgear cabinet walls—in particular a plurality of, preferably four, side walls, a front wall and a rear wall, including an assembly wall. The assembly wall is characterized in that it has said wall aperture/said wall apertures for guiding through the cable to be inserted.

A plurality of the switchgear cabinet walls, for example the four side walls or three of the side walls and a rear wall, etc., in the open state of the switchgear cabinet each have a free edge. These free edges together form a switchgear cabinet opening. One of this plurality of switchgear cabinet walls is the assembly wall. This assembly wall is characterized in that it has wall apertures. These wall apertures are arranged in the assembly wall in the vicinity of its free edge, that is to say in the vicinity of the switchgear cabinet opening. In particular, the wall apertures can be open, that is to say arranged directly at the free edge of the assembly wall and thus directly at the switchgear cabinet opening.

The switchgear cabinet opening can usually be used to allow the manual equipping and cabling of the switchgear cabinet by appropriately trained qualified personnel. If the switchgear cabinet is equipped and cabled, the switchgear cabinet opening—and thus the entire switchgear cabinet—must be closed in a watertight manner. To this end, the switchgear cabinet has said switchgear cabinet closing element.

This switchgear cabinet closing element can be, for example, as already mentioned, a remaining side wall—that is to say not belonging to the group of said plurality of switchgear cabinet walls forming the switchgear cabinet opening—or also the front or rear wall. In particular, this wall can be embodied in the form of a switchgear cabinet door, which is attached for example to the switchgear cabinet opening and can be closed shut, and/or a plate, which can be screwed to the switchgear cabinet at the switchgear cabinet opening, and/or a switchgear cabinet lid, which can be latched to the switchgear cabinet opening, or the like.

In a preferred embodiment, the switchgear cabinet closing element is a side wall of the switchgear cabinet. For example, the rear wall can then be provided as the assembly wall.

The at least one cable inlet device can be attached to the switchgear cabinet inside, that is to say, "from the inside", or outside, that is to say, "from the outside", of the switchgear cabinet. In particular, it can be attached to said assembly wall at the wall aperture from the inside or from the outside and can be pressed with its assembly seal sealingly against the assembly wall of the switchgear cabinet.

Said contact face of the cable inlet device can be arranged on and parallel to a free edge of said assembly wall and can thus adjoin the switchgear cabinet opening, that is to say can terminate in a planar manner therewith.

It is thus possible to press the switchgear cabinet closing element during the closing process with a counterpart seal attached to the switchgear cabinet closing element and running in a straight line against the contact face, that is to say simultaneously against the front face of the frame part and against the closing face of the sealing insert, and thus provide a sealing effect. At the same time, the assembly face of the frame part is pressed with its assembly seal against said assembly wall of the switchgear cabinet. The cables inserted into the switchgear cabinet are guided here through the at least one wall aperture provided in the assembly wall and sealed by the assembly seal and likewise run in a sealed manner and additionally with strain relief to a certain extent through the cable bushing opening of the sealing insert in question. The entire switchgear cabinet is thus closed and sealed off by the closing of the switchgear cabinet closing element.

Depending on the design of the switchgear cabinet, for a particularly strong sealing effect, it may either be expedient for the cable inlet device to attach a separate counterpart seal to the switchgear cabinet closing element, or, for example for cost reasons, to use a seal already provided as standard on the switchgear cabinet closing element, that is to say an existing seal, as counterpart seal.

A method for operating an arrangement of this kind has the following steps:

A. fastening at least one cable inlet device with its frame part from the inside or from the outside to the assembly wall of the switchgear cabinet in the region of the associated wall aperture arranged in the assembly wall and directly to the switchgear cabinet opening of the switchgear cabinet, so that the front face of the at least one frame part terminates flush with a free edge of the assembly wall—and thus also the switchgear cabinet opening of the switchgear cabinet;

B. inserting at least one cable into a matching sealing insert;

C. inserting the at least one sealing insert form fittingly and with frictional engagement into a seal recess of the at least one frame part, so that the closing face of the at least one sealing insert terminates in a planar manner with the front face of the frame part;

D. closing the switchgear cabinet opening of the switchgear cabinet by the switchgear cabinet closing element, wherein the counterpart seal, fastened thereto and running in a straight line, is pressed sealingly by the switchgear cabinet closing element against the contact face of the cable inlet device.

The cable inlet device consists substantially of only a few parts, which additionally can be manufactured economically. The cable inlet device in advantageous embodiments therefore needs only have a frame part, for example formed from injection molded plastics material with one or more sealing inserts inserted therein, for example made of elastic, rubber and/or silicone, or the like. It is thus particularly simple to manufacture, which is also of particular advantage for its production.

A particular advantage of the invention thus lies in the fact that the cable, in the production process, can be inserted into the switchgear cabinet without the use of any tools. In particular, the cable can be installed without the use of any tools. The ultimate sealing of the cable inlet device can be performed here automatically, in particular by simply closing the switchgear cabinet door.

A further advantage of the invention thus lies in the simple manageability. The installation process merely comprises that the one or more frame parts be attached in the switchgear cabinet and the cables be inserted in the correct length provided with the sealing inserts.

An additional advantage lies in the fact that cables can be supplemented subsequently with only minimal effort or can be swapped for other cables, for example if cables of different cross sections/of different numbers are required in the switchgear cabinet.

A particularly great additional advantage of the invention lies in the fact that in this way a particularly large number of cables can be inserted into the switchgear cabinet. Lastly—in contrast to what is known in the prior art—the invention provides an entire edge length of the switchgear cabinet opening for equipping with cables. This can—depending on the design of the switchgear cabinet—have multiple cable inlet devices, each with a plurality of sealing inserts. It is particularly advantageous here that the number of insertable cables thus adapts automatically to the size of the switchgear cabinet.

Furthermore, frequent switches and changes to the equipping of the switchgear cabinet—and thus also its cabling, can also be implemented quickly and easily with minimal effort.

In contrast to arrangements known from the prior art, the cable inlet device is not closed by a separate cable inlet device element, such as a separate bolt. There is thus no need for such a bolt to close off the frame part and to fix the sealing inserts with frictional engagement by the cable inlet device. This simplifies the assembly process and reduces the cost of the production of the cable inlet device from the product perspective. Instead, the cable inlet device is closed cost effectively by a standard switchgear cabinet closing element, which is already provided in the prior art in order to close the switchgear cabinet, but, due to the cable inlet device, experiences an additional application as follows:

When closing the switchgear cabinet, this switchgear cabinet closing element can be pressed, specifically for sealing purposes, in particular with its counterpart seal against the at least one sealing insert of the at least one cable insertion device. This sealing insert can thus be slightly compressed, whereby it is also furthermore able to fix and to seal the at least one cable guided through. Here, by means of a single action, specifically closing the switchgear cabinet closing element, for example the switchgear cabinet door—two functions are thus performed at the same time, as follows:

A.) closing off and sealing off the switchgear cabinet, and

B.) closing the cable inlet device, sealing it off outwardly in order to seal off the cable(s) guided through therein and in particular also to fix said cable(s) therein.

In an advantageous embodiment, the at least one sealing insert can have at least one collar—preferably two, arranged on each side of its closing face—for at least one sided contact with and in particular for engaging around the counterpart seal on both sides. Here, it is particularly advantageous in a preferred embodiment if the counterpart seal, whilst it is pressed against the closing face, is automatically pressed form fittingly and with frictional engagement against at least one of the collars, and in particular is inserted form fittingly and with frictional engagement between the two collars, because it can thus provide a particularly good sealing effect together with the sealing insert.

In an embodiment that is advantageous for compatibility reasons, the cable inlet device can have a plurality of sealing inserts that are identical to one another in respect of the outer contour, and the frame part can have a plurality of seal recesses that are identical to one another. Here, the "outer contour" of the sealing inserts is formed from their sealing contour and the contour of their closing face.

Furthermore, in a further preferred embodiment, at least two of the sealing inserts may differ by the number and/or the diameter of their cable bushing openings. Cables having different cross sections can thus benefit from the stated advantages of the cable insertion device. Furthermore, a sealing insert can also be used to guide through a plurality of cables of preferably smaller cross sections, which advantageously supports the fulfilment of a fundamental need to increase the number of cables to be inserted into the switchgear cabinet.

At least one of the sealing inserts can have, at its at least one cable bushing opening, at least on one side, a—in particular circularly peripheral—holding collar for increasing the holding force for fixing the cable guided through. The outer diameter of the peripheral holding collar may increase towards its free end region. In particular, the holding collar can be funnel shaped, that is to say can have a funnel. By way of said increase of the outer diameter, the cable guided through can be fastened to the sealing insert with a particularly high holding force by means of an annular fixing element, for example a screwable clamp and/or a cable tie, or the like, for strain relief, wherein an undesirable detachment of the annular fixing element from the holding collar is prevented. The holding force of the strain free release means already existing anyway can thus be significantly increased.

In a preferred embodiment, the at least one sealing insert can have a particularly advantageous Shore hardness of 30 40 Shore. This Shore hardness has the advantage that the sealing insert has a comparatively high elasticity, whereby it solves the following problem particularly advantageously:

On the one hand, the closing face should be particularly planar in order to avoid gaps between the cable inlet device and the straight counterpart seal. On the other hand, however, the management of a design induced tolerance of the cable cross section is to be ensured. In practice, the diameters of the used cables have deviations, wherein these deviations—depending on the cable thickness—may lie for example between 1.5 and 2 mm. For sealing inserts having just one cable bushing opening, which is usually provided for thicker cables, tolerances of approximately 2 mm can thus be anticipated. For sealing inserts having a plurality of cable bushing openings, which necessarily have a smaller diameter, deviations of approximately 1.5 mm are to be anticipated. For sealing, a relatively high elasticity and thus said Shore hardness of 30 40 Shore is therefore expedient.

In many cases, the at least one sealing insert, however, should also ensure a sufficient strain relief of the cable guided through, without the use of said annular fixing element.

To this end, the sealing insert in a further advantageous embodiment can have, within its at least one cylindrical cable bushing opening, at least one inner, so called "sealing rib", i.e., for example, an inner peripheral bead. This is expedient in particular in conjunction with its—in particular high—elasticity, because, as a result of this high elasticity, the holding force with respect to the cable guided through initially generally reduces, unfortunately, however, this can advantageously be re balanced by the presence of one such sealing rib, preferably a plurality of such sealing ribs. The presence of a plurality of sealing ribs instead of just one sealing rib additionally has the advantage that not only the holding force, but also the sealing effect can thus generally be increased compared to the use of just one sealing rib.

BRIEF DESCRIPTION OF THE DRAWINGS

An exemplary embodiment of the invention is shown in the drawings and will be explained in detail hereinafter. In the drawings:

FIG. 1a, FIG. 1B, FIG. 1c, FIG. 1d, and FIG. 1e show a switchgear cabinet with a plurality of cable inlet devices in various views;

DETAILED DESCRIPTION

Figure 2A:
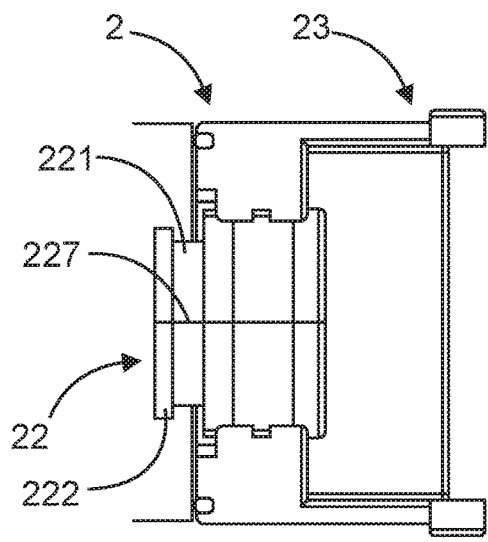
FIG. 2a, FIG. 2b, FIG. 2c, and FIG. 2d show a first cable inlet device with a frame part and a sealing insert in various views.

The figures contain partly simplified, schematic illustrations. Sometimes, identical reference signs have been used for like, but possibly non-identical elements. Different views of like elements may be scaled differently.

FIGS. 1a to 1e show an arrangement for the switchgear cabinet 1 with a plurality of cable inlet devices 2, 2' screwed onto the switchgear cabinet from outside, specifically a first and a second cable inlet device 2, 2'. Here, it should be noted that this illustration is schematic and merely describes the principal structure of the arrangement as clearly as possible. In other, particularly realistic embodiments, the edge lengths of the switchgear cabinet opening may be much larger than in the case of the shown switchgear cabinet opening 10, thus resulting in significantly more space for attachment of further cable inlet devices 2, 2'.

In FIG. 1a, the switchgear cabinet 1 is shown from a vertical view looking at its rear wall 13, onto which the cable inlet devices 2, 2' have been screwed from outside.

Furthermore, the switchgear cabinet 1 has four side walls 11, 11', 11", 11"', of which a first side wall 11 can be seen particularly well in FIG. 1B and functions as a switchgear cabinet closing element, that is to say closes the switchgear cabinet opening 10 in this illustration.

FIG. 1c shows a plan view of a section through the first cable inlet device 2. Here, it can be clearly seen how the first side wall 11 protrudes beyond the rear wall 13 in order to be pressed sealingly against a closing face 223 of a sealing insert 22 of the cable insertion device 2.

FIG. 1d shows a switchgear cabinet opening 10, since the first switchgear cabinet wall 11 has been removed. The view of the inner side of a front wall 12 of the switchgear cabinet 1 through the switchgear cabinet opening 10 has been freed. It can also be seen particularly well from this view that the cable inlet devices 2, 2' are each attached to a lateral wall aperture of the rear wall 13, which is located directly on a free edge of the rear wall 13, whereby the wall aperture is open towards the switchgear cabinet opening 10.

FIG. 1e shows the same arrangement with a vertical view of the switchgear cabinet opening 10.

The rear wall 13 of the switchgear cabinet 1 serves in this embodiment as an assembly wall. The rear wall 13 therefore has the lateral wall apertures, at the region of each of which there is attached a cable inlet device 2, 2', in this case from outside. In an alternative embodiment, the same cable inlet devices 2, 2', however, could also be attached to the rear wall 13 from the inside, i.e., inside the switchgear cabinet 1. By closing the switchgear cabinet 1 by means of the first side wall 11, the cable inlet devices 2, 2' are sealed, thus also ultimately sealing the switchgear cabinet 1.

In other switchgear cabinet designs, not shown here, the same cable inlet devices 2, 2', however, could also be arranged for example at wall apertures of a side wall and could be sealed by a rear wall or alternatively a front wall by closing same. The rear wall of the front wall would then in each case have the function of a switchgear cabinet closing element, whereas the side wall, which would then have the wall apertures, would serve as an assembly wall.

The cable inlet devices 2, 2', 2" described in greater detail hereinafter are advantageously useable independently of this and therefore in an extremely versatile manner also on the aforementioned switchgear cabinets and in principle also a wide range of different switchgear cabinets.

FIGS. 2a-2d show the first cable inlet device 2 in four different views. This first cable inlet device 2 has a frame part 23 with just one single seal recess 236 and accordingly has also just one single sealing insert 22.

FIG. 2a shows the first cable inlet device 2 in a lateral cross-section. In this illustration, it can be clearly seen that the sealing insert 22 has, at its cable bushing opening 220, a holding collar 221 with a funnel 222.

Figure 2B:
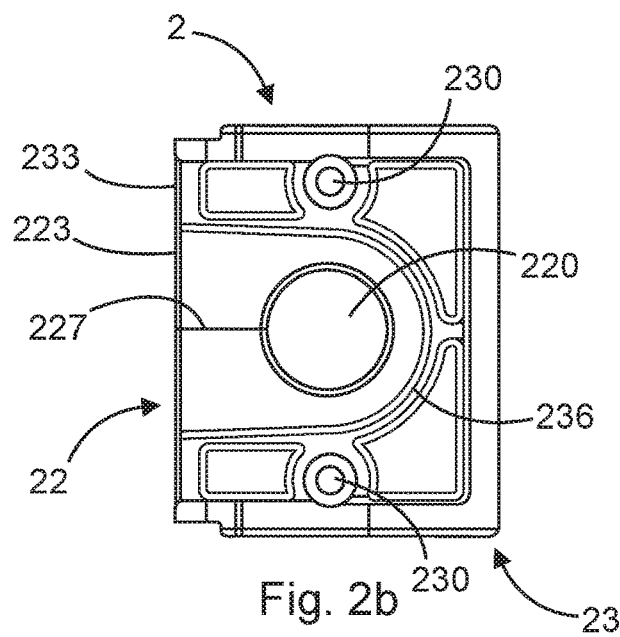

FIG. 2b shows the first cable inlet device 2 in a side view, specifically with a view of the side face, not provided with a reference sign, of the frame part 23 of said device. For manufacturing reasons, the frame part 23 has cavities on this side face.

The frame part 23 also has a level front face 233 arranged at right angles to the side face. This front face 233 is interrupted by the concave, U-shaped sealing recess 236, which extends from the front face 233 into the frame part 23.

The sealing insert 22 inserted by its convex, U-shaped insert contour form-fittingly and with frictional engagement into the seal recess 236 also has a level closing face 223, which terminates in a planar manner with the front face 233 of the frame part 23. In addition, the sealing insert 22 has a continuous cylindrical cable bushing opening 220 and an insertion slot 227 for inserting a cable into the cable bushing opening 220.

As the fastening device, the frame part 23 has a plurality of, in this embodiment two, screw passages 230, which run starting from the assembly side in the direction of the side face, that is to say in the viewing direction in FIG. 2b.

In another embodiment, the frame part 23 can be fastened to the assembly face of the switchgear cabinet 1, instead of by the aforementioned screwing, also in the form of a quick-fastening technique, specifically by means of one or more quick-fastening devices, although these are not shown in the drawing.

Figure 2C:
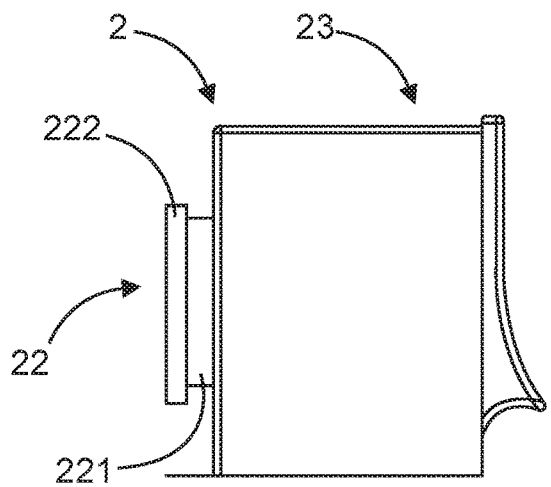

FIG. 2c shows the cable inlet device 2 in a plan view.

Figure 2D:
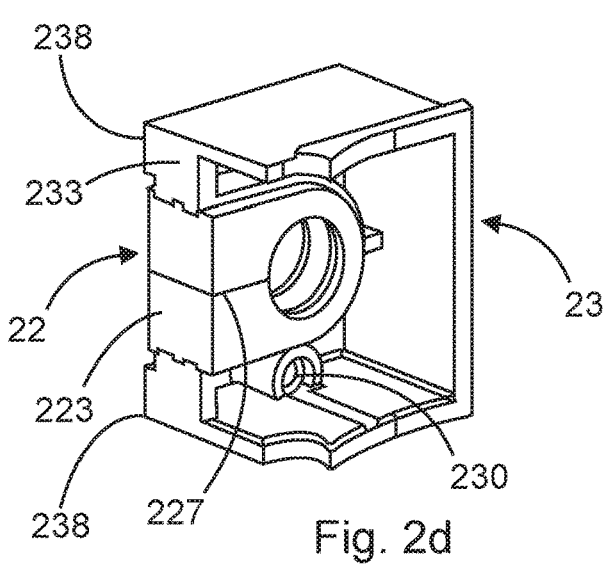

FIG. 2d shows the cable inlet device 2 in an oblique plan view of said side face, not provided with a reference sign. Opposite the side face, the frame part 23 has an assembly face, which likewise is not provided with a reference sign and which is provided for assembly on the assembly wall, that is to say in this embodiment the rear wall 13 of the switchgear cabinet 1. An assembly seal 238 arranged peripherally on three sides is arranged in the assembly face of the frame part 23 and can be seen here merely suggestively—and, in slightly modified form, particularly well in FIGS. 3d and 3e which will follow later.

Figure 2E:
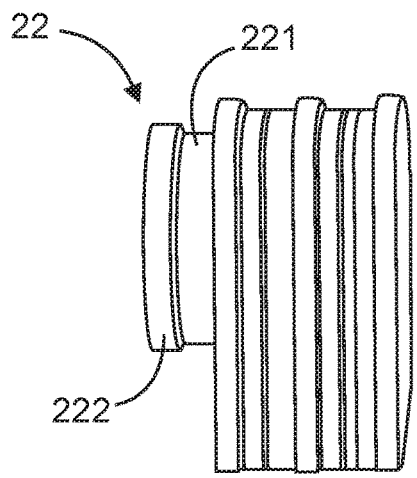
FIG. 2e and FIG. 2f show the sealing insert as a separate individual part in various views.
Figure 2F:
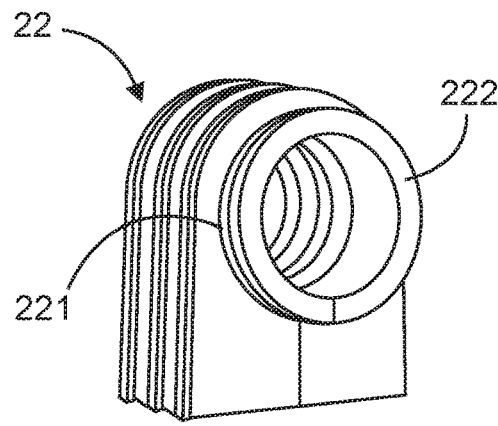

FIGS. 2e and 2f show the sealing element 22 as a separate individual part. In FIG. 2e the holding collar 221 and the funnel 222 of the sealing element 22 can be seen particularly well.

An annular fixing element can be arranged on the annularly peripheral holding collar 221, but is not shown in the drawing. In one embodiment, the annular fixing element is a screwable clamp. In another embodiment, it is a cable tie. The fixing element serves to increase the holding force for the fixing of the cable, which likewise is not shown and is guided through the cable bushing 220.

As a result of the funnel 222, the diameter of the holding collar 221 increases towards its free end region. The annular fixing element, not shown, can thus be held captively on the holding collar 221.

FIGS. 3a-3f show a second cable inlet device 2'.

Figure 3A:
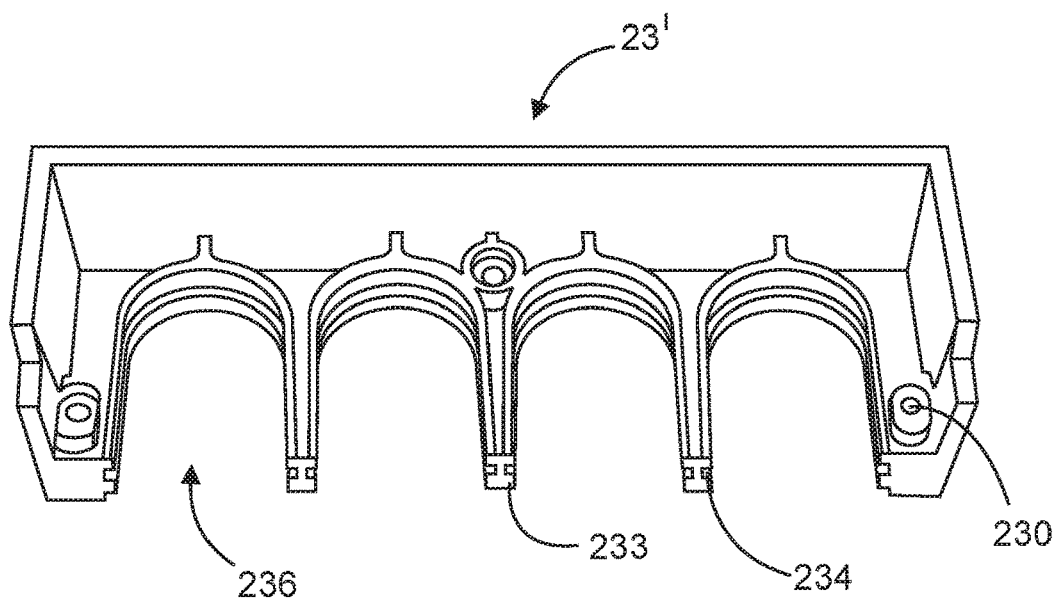
FIG. 3a shows a second frame part as a separate individual part.

In particular, a second frame part 23' is shown in FIG. 3a as a separate individual part. This part 23' has four identical seal recesses 236 of the aforementioned kind. The front face 233 can be seen between the seal recesses 236. In other words, the front face 233 is interrupted multiple times by the seal recesses 236. Positioning recesses 234 are arranged at each of the seal recesses 236. In this case, the positioning recesses each run in the form of a channel through the inner edge of the entire concave, U-shaped seal recess 236 and are arranged with their ends in the front face 233.

Figure 3B:
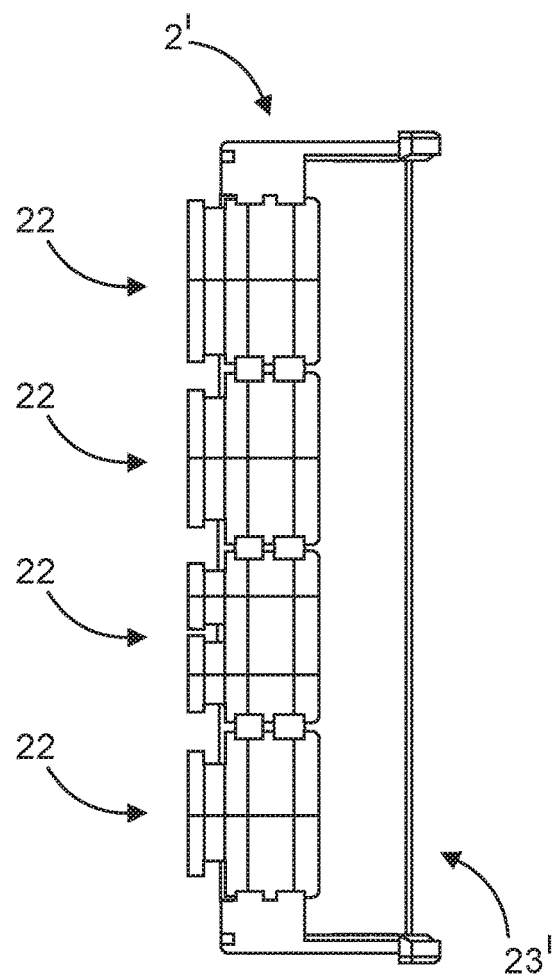
FIG. 3b and FIG. 3c show a second cable inlet device with the second frame part and four different sealing inserts in various views.
Figure 3C:
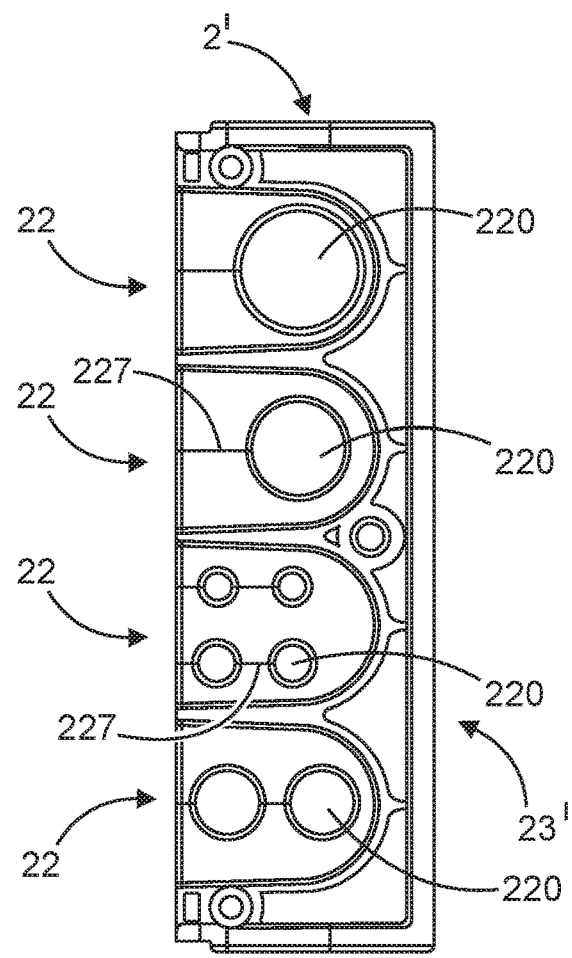

As shown in FIGS. 3b and 3c, different sealing inserts 22 can then be inserted into the seal recesses 236.

The sealing inserts each have, at least on their closing face 224, at least one integrally molded positioning shaping 224, in this case an integrally molded positioning shaping that runs peripherally around the insertion contour of the sealing insert. This integrally molded positioning shaping tool 224 engages at least form-fittingly, and in particular form-fittingly and with frictional engagement, in the associated positioning recess 234 of the associated seal recess 236 in order to exactly position the sealing insert 22 in question.

Although the four sealing inserts 22 shown here differ in the size and/or number of their cable passage openings 220 and in the length of their insertion slots 227, they are provided with the same reference sign, since they are equal to one another and additionally also have a comparable function.

Figure 3D:
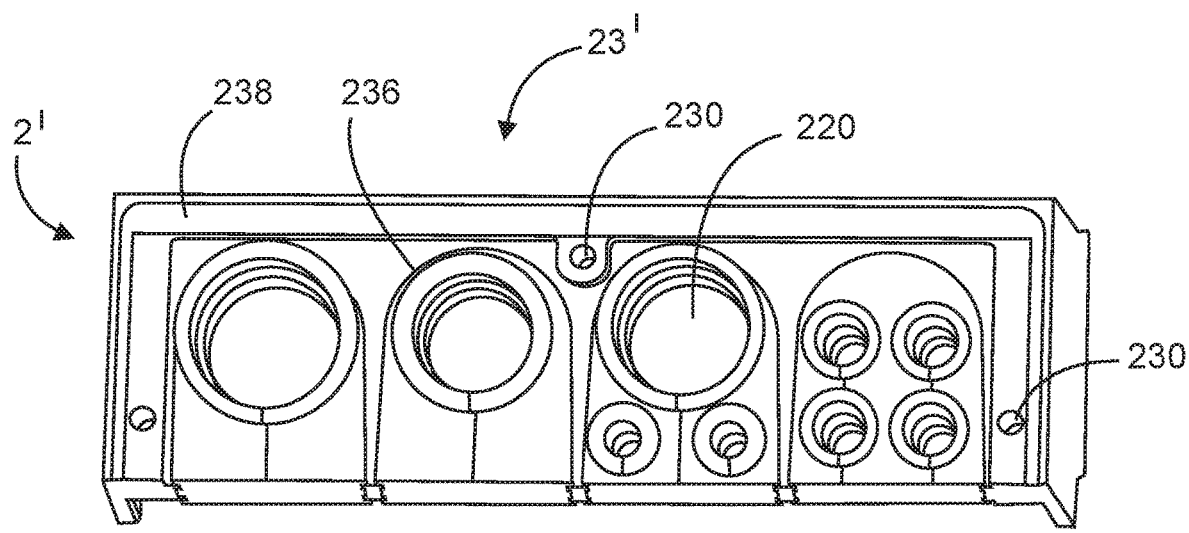
FIG. 3d and FIG. 3e show the second cable inlet device with amended equipping in various views.
Figure 3E:
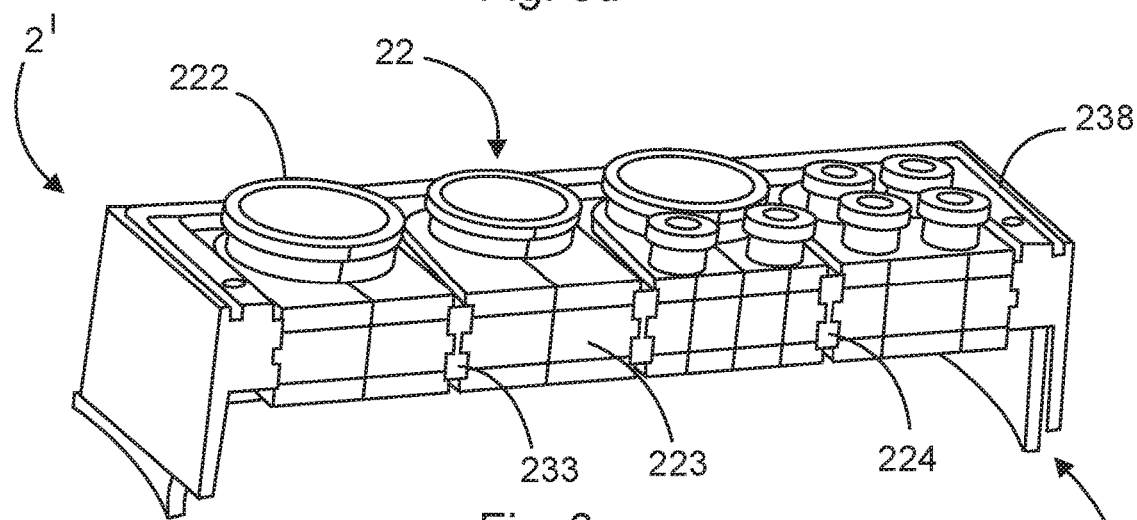

FIGS. 3d and 3e further show the second cable inlet device 2', but with the slight difference that some of the sealing inserts 22 have been swapped in comparison to the previous illustrations or have been exchanged for other sealing inserts 22.

Since these sealing inserts 22 have the same basic shape in comparison to one another, that is to say the same U-shaped insert contour and the same closing face 223, and furthermore the seal recesses 236 of the frame parts 23, 23' 23" also match one another. These sealing inserts 22 can be exchanged arbitrarily for one another, specifically depending on the requirements, which is of course extremely advantageous for reasons of compatibility.

In these two illustrations, the assembly seal 238, already mentioned briefly, of the frame part 23 can also be seen clearly. The assembly seal 238 is held in a U-shaped sealing groove of the assembly side and engages around the seal recesses 236 on three sides. As a result of the assembly seal 238, the assembly face is defined, i.e., the outer face of the frame part 2' in which the assembly seal 238 is arranged is considered to be the assembly face.

Lastly, the frame part 23 is intended to be pressed with its assembly face, and thus also with its assembly seal 238, sealingly in the region of the particular wall aperture against the assembly wall, that is to say in this case against the rear wall 13 of the switchgear cabinet 1.

Figure 3F:
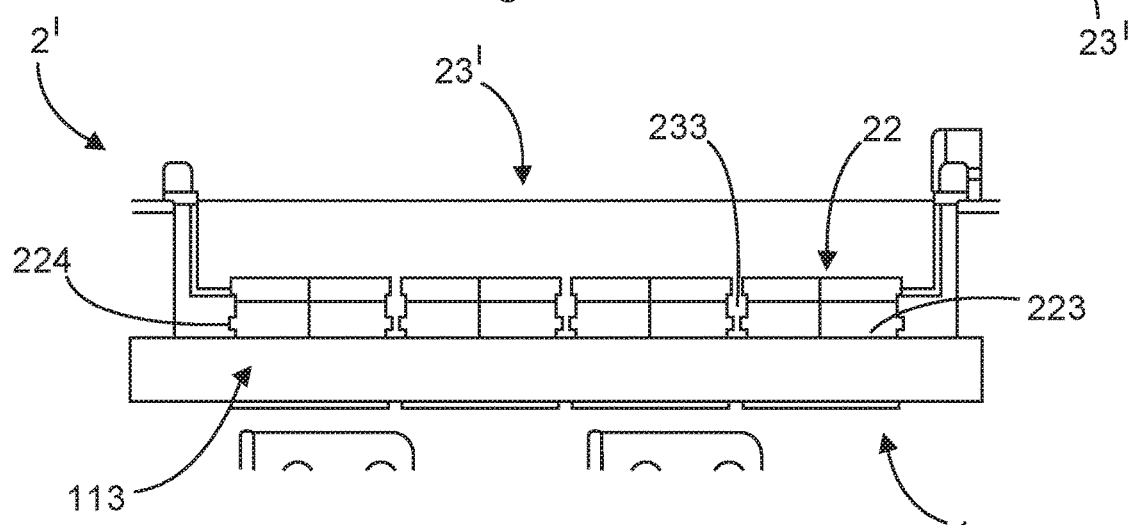
FIG. 3f shows the second cable inlet device with a counterpart seal.

FIG. 3f shows the second cable insertion device 2' in its sealed state, fitted on the switchgear cabinet 1, with a view from the direction of the switchgear cabinet closing element, that is to say in this case of the first side part 11, in section through a counterpart seal 113, which runs in a straight line and which is attached on the inner side to the switchgear cabinet closing element (side part 11).

Here, it is easily conceivable how the counterpart seal 113 is pressed, by the closing of the switchgear cabinet by means of the switchgear cabinet closing element—that is to say in this embodiment by the side wall 11—against a level contact face of the cable inlet device 2', wherein the contact face is formed from the front face 233 of the frame part 23 and the closing face 223 of the sealing inserts 22.

In the shown illustration, the counterpart seal 113 is narrower than said contact face. In another embodiment, the counterpart seal 113, however, can also be just as broad as the closing face 223 of the sealing insert 22.

Figure 4A:
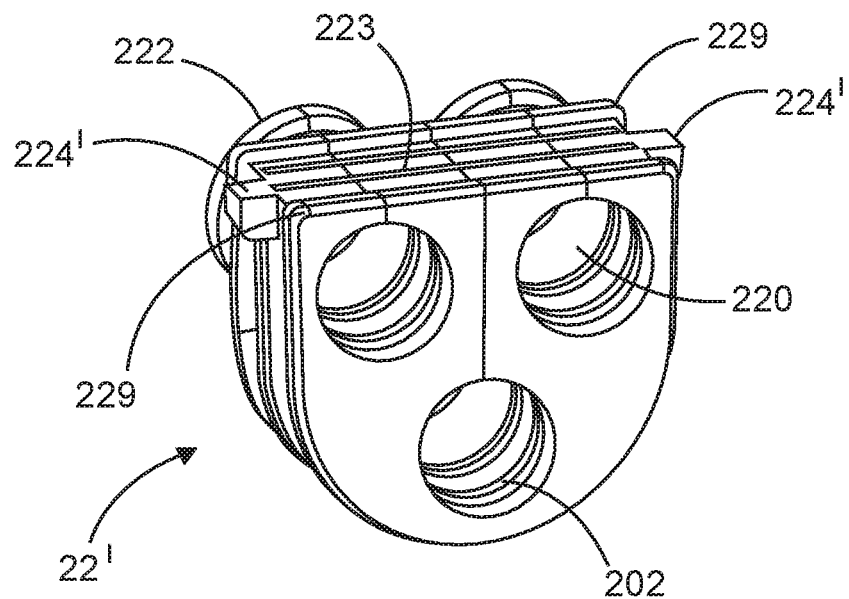
FIG. 4a shows an individual modified sealing insert.

FIG. 4a shows a slightly modified sealing insert 22' in a slightly modified embodiment. This sealing insert has a particularly high sealing effect. On either side of the closing face 223, it has a collar 229 running in a straight line. If the counterpart seal 113, as indicated previously, is now just as broad as the closing face 223, the counterpart seal can thus be inserted form-fittingly and in particular also form-fittingly and with frictional engagement, between the two collars 229 and can be pressed against the closing face 223, thus improving the quality of the seal significantly. What's more, the sealing effect is significantly improved also with only one-sided contact of the counterpart seal 113 with one of the two collars 229.

In addition, the modified sealing insert 22', as well as the sealing insert 22 mentioned beforehand, has two sealing ribs 202 within its cable through-opening 220. A sufficient holding force with respect to a cable guided through is thus maintained even if the sealing insert 22' consists of a particularly elastic material, for example with a Shore hardness of 20-30 Shore.

Furthermore, the integrally molded positioning shapings 224' are slightly lengthened compared to the aforementioned embodiment, at least in the region of the closing face 223.

Figure 4B:
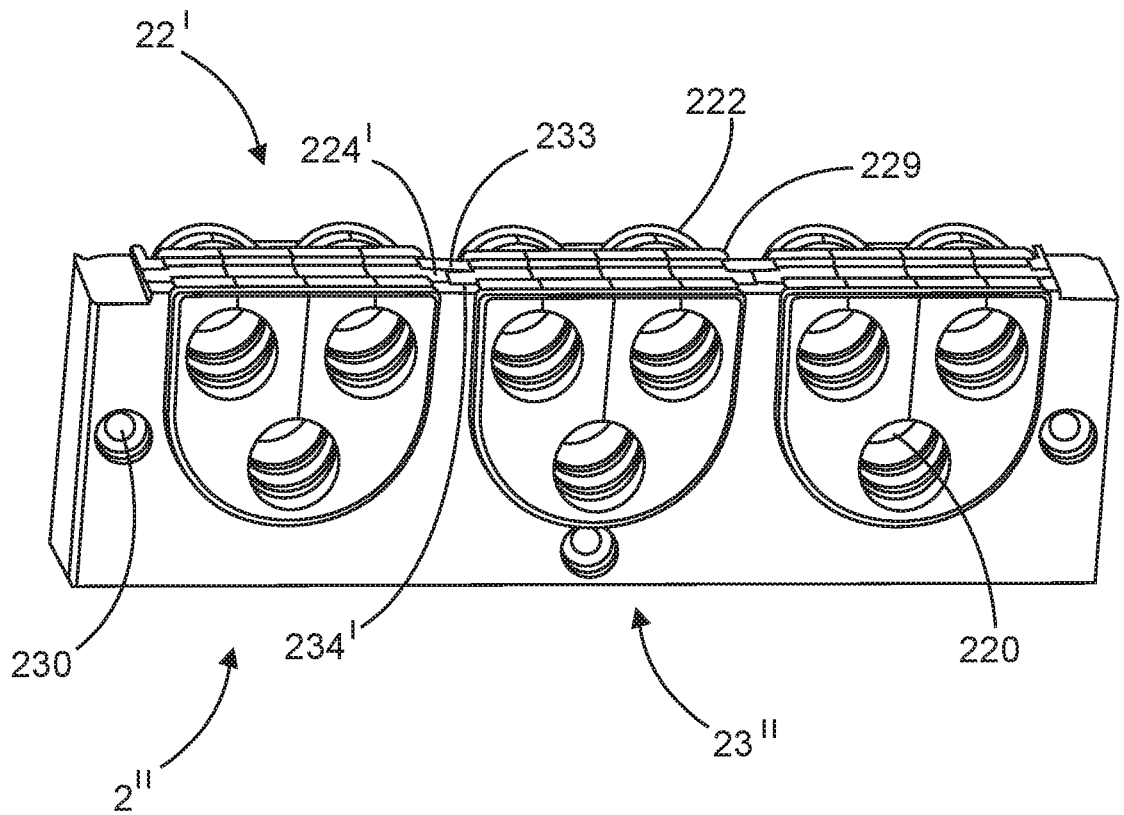
FIG. 4b shows a third cable inlet device with three modified sealing inserts.

From FIG. 4b with a view of the side face of a third embodiment of the frame part 23" of a third cable inlet device 2", the following is evident:

Also in the front face 233 of the third frame part 23", the positioning recesses 234' are enlarged compared to the aforementioned embodiment and are directly adjacent to one another. The integrally molded positioning shapings 224' of adjacent sealing inserts 22' in the installed state are thus directly adjacent to one another, which in the sealed state, that is to say with counterpart seal 113 pressed thereagainst, allows a particularly strong seal.

Although the figures show different aspects or features of the invention in combination, it is evident to a person skilled in the art—unless stated otherwise—that the shown and discussed combinations are not the only possible ones. In particular, units or feature combinations corresponding to one another from different exemplary embodiments can be swapped for one another.

LIST OF REFERENCE SIGNS 1 switchgear cabinet
11, 11', 11", 11''' side walls
12 front wall
13 rear wall
2, 2', 2" cable inlet device
22, 22' (modified) sealing insert
220 cable bushing opening
221 holding collar
222 funnel
223 closing face
224, 224' integrally molded positioning shapings
227 insertion slot
229 collar
23, 23', 23" frame part
230 screw passage
233 front face
234, 234' positioning recesses
236 seal recess

The invention claimed is:

1. A cable inlet device (2, 2', 2") for a switchgear cabinet (1), comprising:
a rigid frame part (23, 23', 23"), which, in order to be fastened in or the switchgear cabinet (1), has a fastening device,
wherein the frame part (23, 23', 23") has a planar assembly face with an assembly seal (238) for sealing with respect to a switchgear cabinet wall (13) provided for this purpose as a flat assembly wall, and
wherein the frame part (23, 23', 23") has a side face opposite the planar assembly face, wherein the planar assembly face and the side face are connected to one another via a front face (233),
wherein the front face (233) runs level, in order, in an assembled state on a switchgear cabinet opening (10) of the switchgear cabinet (1), to terminate in a planar manner with a free edge of the flat assembly wall (13),
wherein the frame part (23, 23', 23") has at least one U-shaped seal recess (236) starting on the front face (233) and extending into the frame part (23, 23', 23"),
wherein the cable inlet device (2, 2', 2") furthermore has at least one elastic sealing insert (22, 22'), insertable form fittingly and with frictional engagement into the corresponding seal recess (236) of the frame part (23, 23', 23") by its convex U shaped insert contour complementary to the seal recess,
wherein the at least one sealing insert (22, 22') has
at least one continuous, cylindrical bushing opening (220) having an axial extension perpendicular to the planar assembly face and
an insertion slot (227) for inserting a cable into the cable bushing opening (220),
wherein each sealing insert (22, 22') furthermore has a level closing face (223), and
wherein this closing face (223) of the at least one sealing insert (22, 22'), in an inserted state thereof, terminates flush with the front face (233) of the frame part (23, 23', 23").

2. The cable inlet device (2, 2', 2") as claimed in claim 1, wherein the at least one sealing insert (22, 22') has, arranged on each side of its closing face (223), a collar (229), which in the inserted state runs linearly along a first longitudinal side of the frame part (23, 23', 23"), for engaging around a counterpart seal (113) form-fittingly and with frictional engagement on both sides.

3. The cable inlet device (2, 2', 2") as claimed in claim 1, wherein the cable inlet device (2, 2', 2") has at least two sealing inserts (22, 22') that are identical to one another in respect of their outer contour, and wherein the frame part (23, 23', 23") has at least two seal recesses (236) that are identical to one another.

4. The cable inlet device (2, 2', 2") as claimed in claim 1, wherein at least two of the sealing inserts (22, 22') differ by a number and/or a diameter of their cable bushing openings (220).

5. The cable inlet device (2, 2', 2") as claimed in claim 1, wherein at least one of the sealing inserts (22, 22') has, at its at least one cable bushing opening (220), at least on one side, a peripheral holding collar (221) as well as an annular fixing element for increasing a holding force when fixing a cable guided through.

6. The cable inlet device (2, 2', 2") as claimed in claim 5, wherein an outer diameter of the peripheral holding collar (221) increases towards its free end region, in order to hold the annular fixing element captively on the holding collar (221).

7. The cable inlet device (2, 2', 2") as claimed in claim 6, wherein the annular fixing element is a screwable clamp or a cable tie.

8. The cable inlet device (2, 2', 2") as claimed in claim 5, wherein the peripheral holding collar (221) has a funnel (222).

9. The cable inlet device (2, 2', 2") as claimed in claim 1, wherein a material of the at least one sealing insert (22, 22') has a Shore hardness of 30-40 Shore.

10. The cable inlet device (2, 2', 2") as claimed in claim 1, wherein the at least one sealing insert (22, 22') has, within its at least one cylindrical cable bushing opening (220), at least one sealing rib (202), in order to ensure a maximum holding force with respect to the cable guided through, in spite of the elasticity of the sealing insert (22, 22').

11. The cable inlet device (2, 2', 2") as claimed in claim 1,
wherein the frame part (23, 23', 23") has a plurality of screw passages (230) as forming the fastening device.

12. The cable inlet device as claimed in claim 1,
wherein the fastening device of the frame part (23, 23', 23") comprises either
at least one detent window and at least one separate quick fastening device or
at least one quick fastening device fixedly connected to the frame part (23, 23', 23").

13. An arrangement, comprising:
at least one cable inlet device (2, 2', 2") as claimed in claim 1; and
a switchgear cabinet (1) having a switchgear cabinet opening (10) and a switchgear cabinet closing element (11), by which the switchgear cabinet opening (10) can be closed,
wherein the at least one cable inlet device (2, 2', 2") is attached in or on the switchgear cabinet (1) in a region of a wall aperture of an assembly wall (13) of the switchgear cabinet (1) and is pressed sealingly with its assembly seal (238) against this assembly wall (13),
wherein the assembly seal (238) surrounds the wall aperture at least on three sides,
wherein the front face (233) of the frame part (23, 23', 23") together with the closing face (223) of its sealing inserts (22, 22') adjoin the switchgear cabinet opening (10) in a manner planar with a free edge of the assembly wall (13) and is therefore pressed and thus sealed by the switchgear cabinet closing element (11) in a closed state against a counterpart seal (113) fastened to the switchgear cabinet closing element and running in a straight line.

14. The arrangement as claimed in claim 13,
wherein the switchgear cabinet closing element is
a switchgear cabinet door that is attached to the switchgear cabinet opening (10) and can be closed shut and/or
a plate that can be screwed to the switchgear cabinet (1) at the switchgear cabinet opening (10), and/or
a switchgear cabinet wall (11) of the switchgear cabinet (1) that can be latched to the switchgear cabinet opening (10) or
a switchgear cabinet lid that can be latched to the switchgear cabinet opening (10).

15. A method for operating the arrangement as claimed in claim 13, comprising the following steps:
A. fastening the at least one cable inlet device (2, 2', 2") with its frame part (23, 23', 23") from inside or from outside to the assembly wall (13) of the switchgear cabinet (1) at the wall aperture and directly to the switchgear cabinet opening (10) of the switchgear cabinet (1), so that the front face (233) of the frame part (23, 23', 23") terminates flush with the a free edge of the assembly wall (13) and thus also with the switchgear cabinet opening (10) of the switchgear cabinet (1);
B. inserting at least one cable into the at least one sealing insert (22, 22');
C. inserting the at least one sealing insert (22, 22') form fittingly and with frictional engagement into a seal recess (236) of the frame part (23, 23', 23"), so that the closing face (223) of the at least one sealing insert (22, 22') terminates in a planar manner with the front face (233) of the frame part (23, 23', 23"); and
D. closing the switchgear cabinet opening (10) of the switchgear cabinet (1) by the switchgear cabinet closing element (11), wherein the counterpart seal (113), fastened thereto and running in a straight line, at the same time is pressed sealingly by the switchgear cabinet closing element (11) against the closing face (223) of the at least one sealing insert (22, 22') and against the front face (233) of the frame part (23, 23', 23").

16. The cable inlet device (2, 2', 2") as claimed in claim 1, wherein the assembly seal (238) is of a U-shape.

17. The cable inlet device (2, 2', 2") as claimed in claim 1, wherein the at least one sealing insert (22, 22') has at least one integrally molded positioning shaping tool (224, 224'), runs peripherally around insertion contour of the at least one sealing insert (22, 22').

* * * * *